United States Patent [19]
Frye et al.

[11] Patent Number: 4,939,480
[45] Date of Patent: Jul. 3, 1990

[54] METHOD AND APPARATUS FOR AMPLIFYING SIGNALS

[75] Inventors: William H. Frye, Goleta; James E. Sorenson, Nipomo, both of Calif.

[73] Assignee: Santa Barbara Research Center, Goleta, Calif.

[21] Appl. No.: 121,327

[22] Filed: Nov. 16, 1987

[51] Int. Cl.⁵ .............................................. H03F 3/45
[52] U.S. Cl. .................................. 330/260; 330/261; 330/297; 250/334
[58] Field of Search ..................... 330/260, 261, 297; 250/330-334

[56] References Cited

U.S. PATENT DOCUMENTS

| | | | |
|---|---|---|---|
| 3,916,333 | 10/1975 | Zuk | 330/260 X |
| 4,423,437 | 12/1983 | Beck et al. | 250/334 X |
| 4,471,321 | 9/1984 | Bowers | 330/261 |
| 4,749,852 | 6/1988 | Takahashi | 330/260 X |

OTHER PUBLICATIONS

*Computer Design*, Apr. 1978, pp. 202, 204.
Dekok et al., "Monolithic Instrumentation Amplifier", *Electrical Engineering*, vol. 3, No. 3, Jul. 1978, pp. 225–236.

*Primary Examiner*—Nelson Moskowitz
*Attorney, Agent, or Firm*—W. C. Schubert; W. K. Denson-Low

[57] ABSTRACT

An method and apparatus for amplifying signals from an elemental detector in a detector array (10) is disclosed. The apparatus comprises a preamplifier (26) for amplifying the output of the elemental detector. The preamplifier comprises first differential amplifier (170) and a circuit (174) for lowering the gain of the first differential amplifier. The apparatus further comprises a postamplifier (28) for amplifying the output of the preamplifier (26). The postamplifier (28) comprises a second differential amplifier (370) and a circuit (374) for lowering the gain of the second differential amplifier.

18 Claims, 7 Drawing Sheets

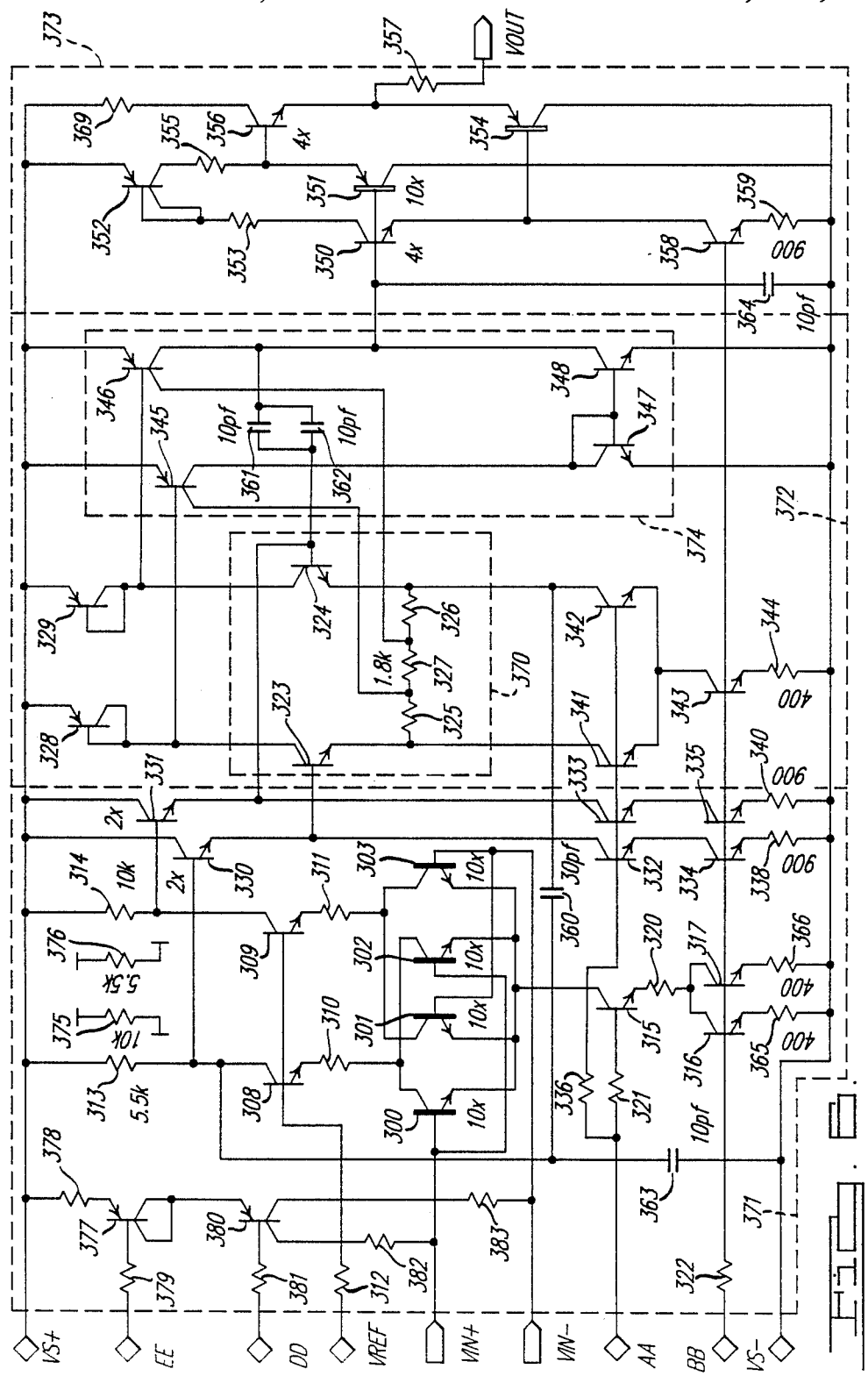

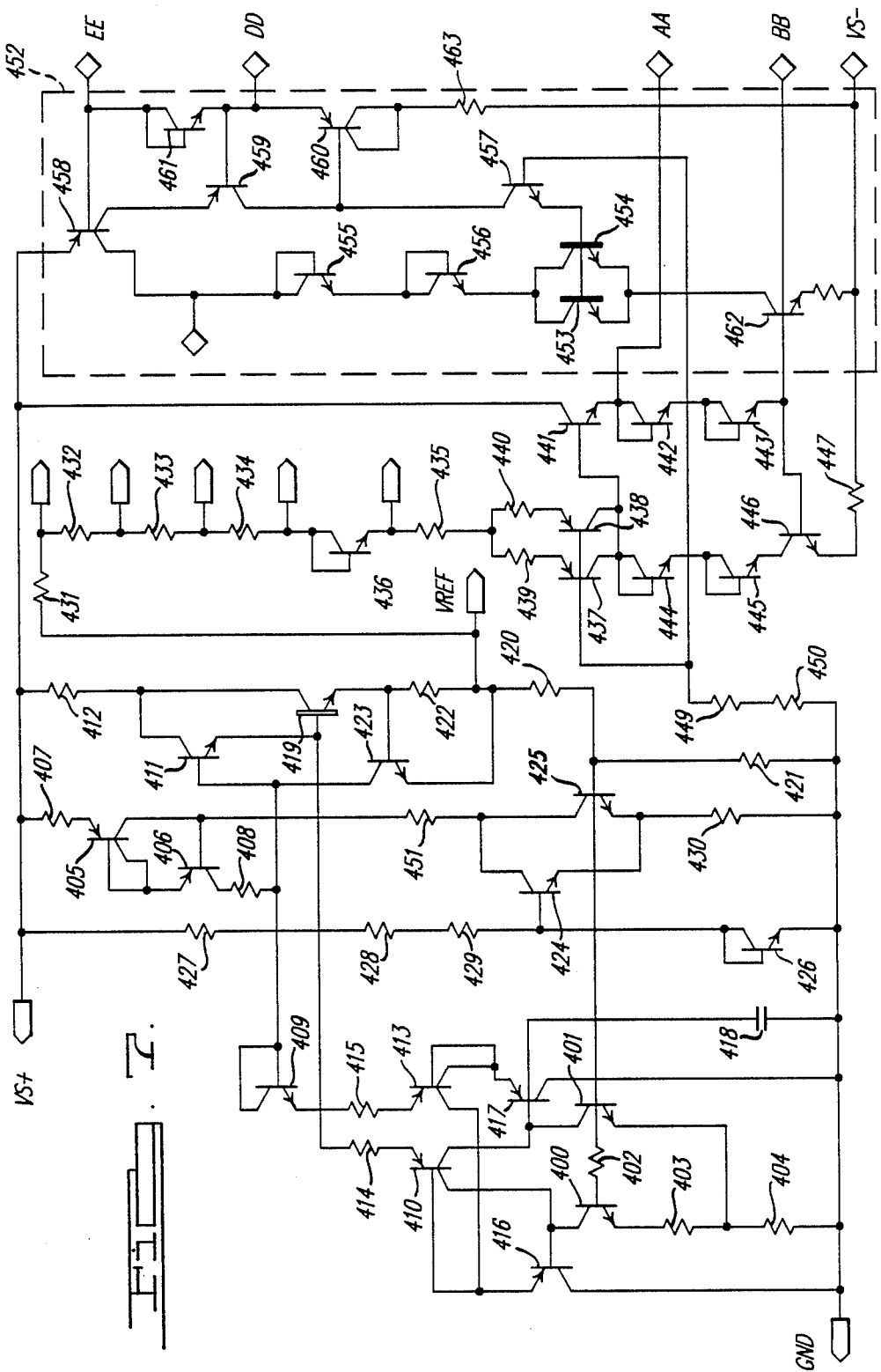

ical to that described in Hudson, *Infrared Systems Engineering*, John Wiley & Sons, 1969 at FIG. 5-20, which is hereby incorporated by reference. The

METHOD AND APPARATUS FOR AMPLIFYING SIGNALS

BACKGROUND OF THE INVENTION

1. Field of the Invention

This invention relates to the field of signal amplification, and more particularly concerns the method and apparatus for amplifying signals from elemental detectors from a detector array.

2. Description of Related Art

Elemental infrared detectors are often used in surveillance, target seeking, and search and tracking imaging systems to sense the presence of electromagnetic radiation with wavelengths from 1–30 $\mu$m. To detect infrared radiation, these elemental detectors often use temperature sensitive pyroelectric and ferroelectric materials such as triglicine sulfate and lanthanum doped lead zirconate titanate. Such crystals exhibit spontaneous electrical polarization in response to incident infrared radiation which creates a potential drop across electrodes attached to the crystals. Photoconductive materials such as lead-sulfide and mercury-cadmium-telluride may also be used in which the resistance of the material changes as a function of incident radiation. Finally, photovoltaic devices such as those fabricated from mercury-cadmium-telluride, indium antimonide, or similar materials having a standard P/N junction may be used for infrared detection. In such devices, intrinsic band-to-band electron-hole excitation generates a current or voltage which is proportional to the incident radiation flux.

Arrays of such elemental detectors may be used to form thermal imaging systems. In real-time thermal imaging systems such as forward looking infrared ("FLIR") imaging sensors, oscillating prism mirrors are used to scan radiation emitted by a source across a one-dimensional array of elemental detectors. When the elemental detectors are used in this manner, the temporal outputs of the detectors may be used to generate a two-dimensional representation of the image. In two-dimensional detector array imaging systems which can utilize either staring or scanning arrays, the elemental detectors produce free charge carriers or currents which may then be monitored by an appropriate readout integrated circuit such as a charge-coupled device ("CCD"). The output from the CCD can be processed by various techniques such as time delay integration and parallel-to-serial scan conversion, with the choice depending on the system requirements of frame rate, signal-to-noise ratios, etc. Other readout devices may also be used.

The outputs from detector arrays are typically delivered to a plurality of amplifiers, each of which may include a preamplifier and a postamplifier. In the case of impedance photoconductors such as those using low wavelength mercury-cadmium-telluride, a low-power/low-noise amplifier is required which is typically connected to a temperature and voltage stable detector bias voltage regulator. However, such amplifiers often have much relatively poor rejection of power and common mode noise. In addition, the fact that such amplifiers often have relatively large power consumption tends to limit the number of amplifiers which can be placed on a single chip. For example, the OP 27 amplifier can not be used in integrated detector packages where a relatively high number of amplifiers are required.

SUMMARY OF THE INVENTION

A method and apparatus for amplifying signals from an elemental detector in a detector array is disclosed. The apparatus comprises a preamplifier for amplifying the output of the elemental detector. The preamplifier comprises a first differential amplifier and means for lowering the gain of the first differential amplifier. The apparatus further comprises a postamplifier for amplifying the output of the preamplifier. The postamplifier comprises a second differential amplifier and means for lowering the gain of the second differential amplifier.

BRIEF DESCRIPTION OF THE DRAWINGS

Various advantages of the present invention will become apparent to one skilled in the art upon reading the following specification and reference to the following drawings in which:

FIG. 6 is a schematic diagram of the postamplifier shown in FIG. 3; and

FIG. 7 is a schematic diagram of the voltage regulator shown in FIG. 3 used for providing a regulated source of voltage to the postamplifiers.

DESCRIPTION OF THE PREFERRED EMBODIMENTS

Figure 1:
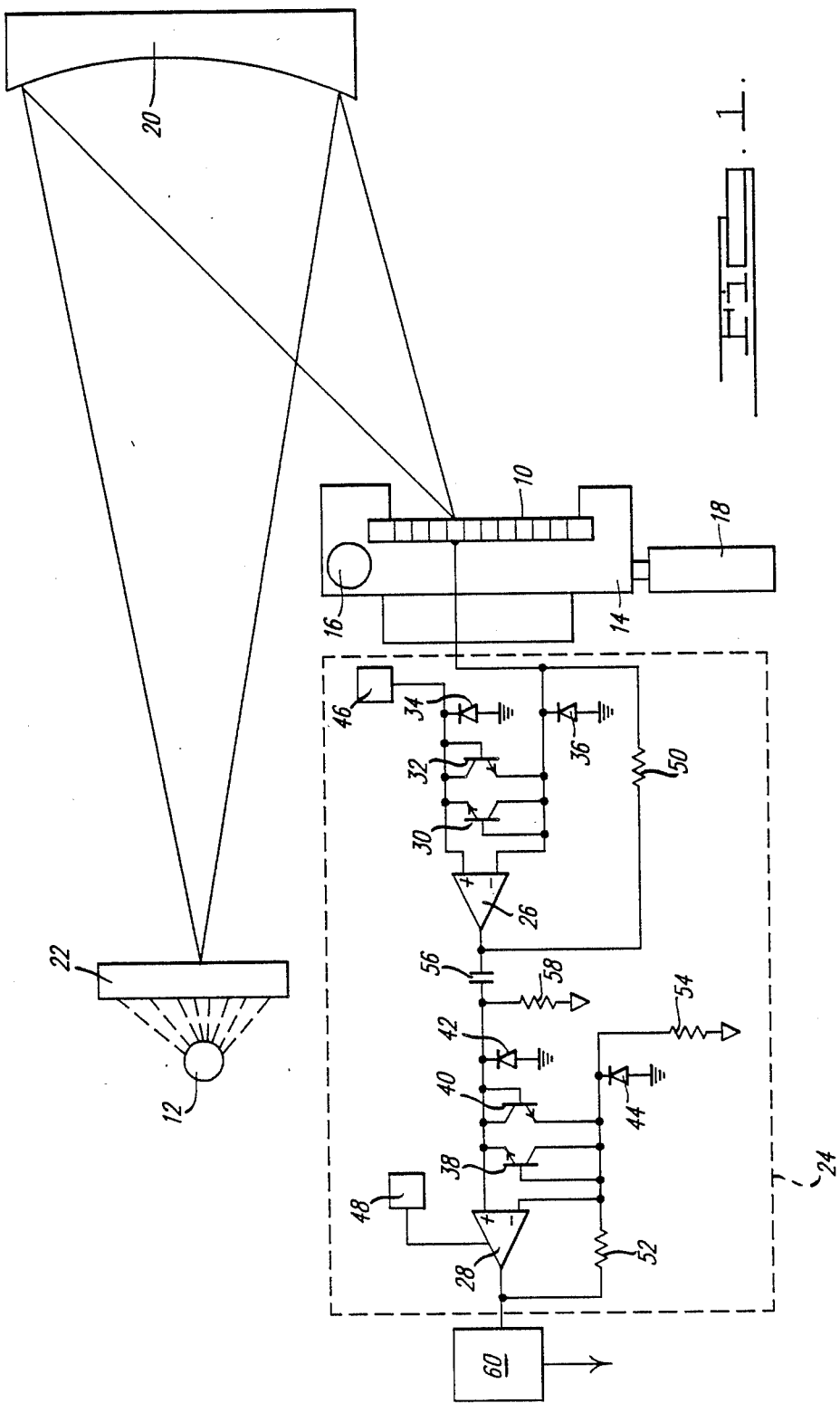
FIG. 1 is a diagrammatic side illustration of the operation of an imaging sensor having an apparatus for amplifying signals from an elemental detector in a detector array according to the teachings of the preferred embodiment of the present invention.

Referring to FIG. 1, a detector array 10 is provided to detect a thermal image in the field-of-view of the array 10. The thermal image may be generated by different intensities of infrared radiation emitted by a source 12. The detector array 10 comprises a plurality of elemental detectors each able to recieve a portion of the thermal energy emitted from the source 12 which lies within its field-of-view.

To position the thermal image on the elemental detectors, a detector mount 14 is provided. The detector mount 14 includes a horizontal positioner 16 and a vertical positioner 18. The horizontal positioner 16 allows the image to be horizontally located on a particular element in the detector array 10, while the vertical positioner 18 allows vertical positioning of the image on the detector array 10. By suitable adjustment of the horizontal and vertical positioners 16 and 18, a predetermined portion of the image can be focused on selected elemental detectors of the detector array 10.

To deliver the thermal image to the detector array 10, a re-imaging mirror 20 is provided. The re-imaging mirror 20 as shown in FIG. 1 is used to symbolize the collecting telescope optics of a thermal imaging system and may be similar to that described in Hudson, *Infrared Systems Engineering*, John Wiley & Sons, 1969 at FIG. 5–20, which is hereby incorporated by reference. The re-imaging mirror 20 receives the thermal image from the source 12 through a diffuser 22 and directs the image to the detector array 10. The diffuser 22 is used to optically increase the uniformity of the thermal image delivered to the re-imaging mirror 20. While the diffuser 22 may be fabricated from a ground dielectric transmission material, other suitable materials may be used.

To provide an apparatus for amplifying the output from the elemental detector array 10, the amplifier 24 is provided. The amplifier 24 comprises a preamplifier 26 and a postamplifier 28. The preamplifier 26 receives the output from the detector array 10 through its inverting input, while the postamplifier 28 receives the output of the preamplifier 26 through its non-inverting input. The inverting input of the preamplifier 26 is connected to the collector and the base of the transistor 30. Because the emitter of the transistor 30 is connected to the non-inverting input of the preamplifier 26, the transistor 30 ensures that the voltage at the non-inverting input of the preamplifier 26 does not exceed the voltage at the non-inverting input of the preamplifier 26 by approximately 0.7 volts. Similarly, the non-inverting input of the preamplifier 26 is connected to the collector and the base of the transistor 32, while the emitter of the transistor 32 is connected to the inverting input to the preamplifier 26. Accordingly, the transistor 32 ensures that the voltage at the non-inverting input of the preamplifier 26 does not exceed the voltage at the inverting input of the preamplifier 26 by approximately 0.7 volts. In addition, the diodes 34 and 36 are connected between ground and the inverting and non-inverting inputs of the preamplifier 26 respectively to ensure that the voltage at the inverting and non-inverting inputs do not become more negative than −0.7 volts.

Similarly, the base of the collector of the transistor 38 is connected to the inverting input of the postamplifier 28, while the emitter of the transistor 38 is connected to its non-inverting input. In addition, the base and the collector of the transistor 40 is connected to the non-inverting input of the postamplifier 28, while the emitter of the transistor 40 is connected to the inverting input of the postamplifier 28. The transistors 38 and 40 therefore prevent the difference in voltage between the inverting and non-inverting inputs of the postamplifier 28 from exceeding 0.7 volts. In addition, the diodes 42 and 44 are connected between ground and the non-inverting and inverting inputs of the postamplifier 28 respectively to ensure that the voltage at the inverting and non-inverting inputs of the postamplifier 28 does not become more negative than −0.7 volts.

A voltage regulator 46 is connected to the non-inverting input of the preamplifier 26 which supplies the preamplifier 26 with a regulated source of voltage. Similarly, a voltage regulator 48 is connected to the postamplifier 28 which also provides a regulated source of voltage. To provide feedback for the preamplifier 26 and the postamplifier 28, the resistors 50 and 52 are provided. The resistor 50 is connected between the output and the inverting input of the preamplifier 26, while the resistor 52 is connected between the output and the inverting input of the postamplifier 28. In addition, a resistor 54 is connected between the inverting input of the postamplifier 28 and ground which is used to select the gain of the postamplifier 28. To limit A.C. coupling between the preamplifier 26 and the postamplifier 28, a coupling capacitor 56 and a resistor 58 are provided. The coupling capacitor 56 and the resistor 58 are used to remove the D.C. bias potential supplied to the detector array 10. To process the signals amplified by the preamplifier 26 and the postamplifier 28, the postamplifier 28 is connected to a signal processor 60. The output from the processor 60 is used to evaluate the thermal images received by the detector array 10.

Figure 2:
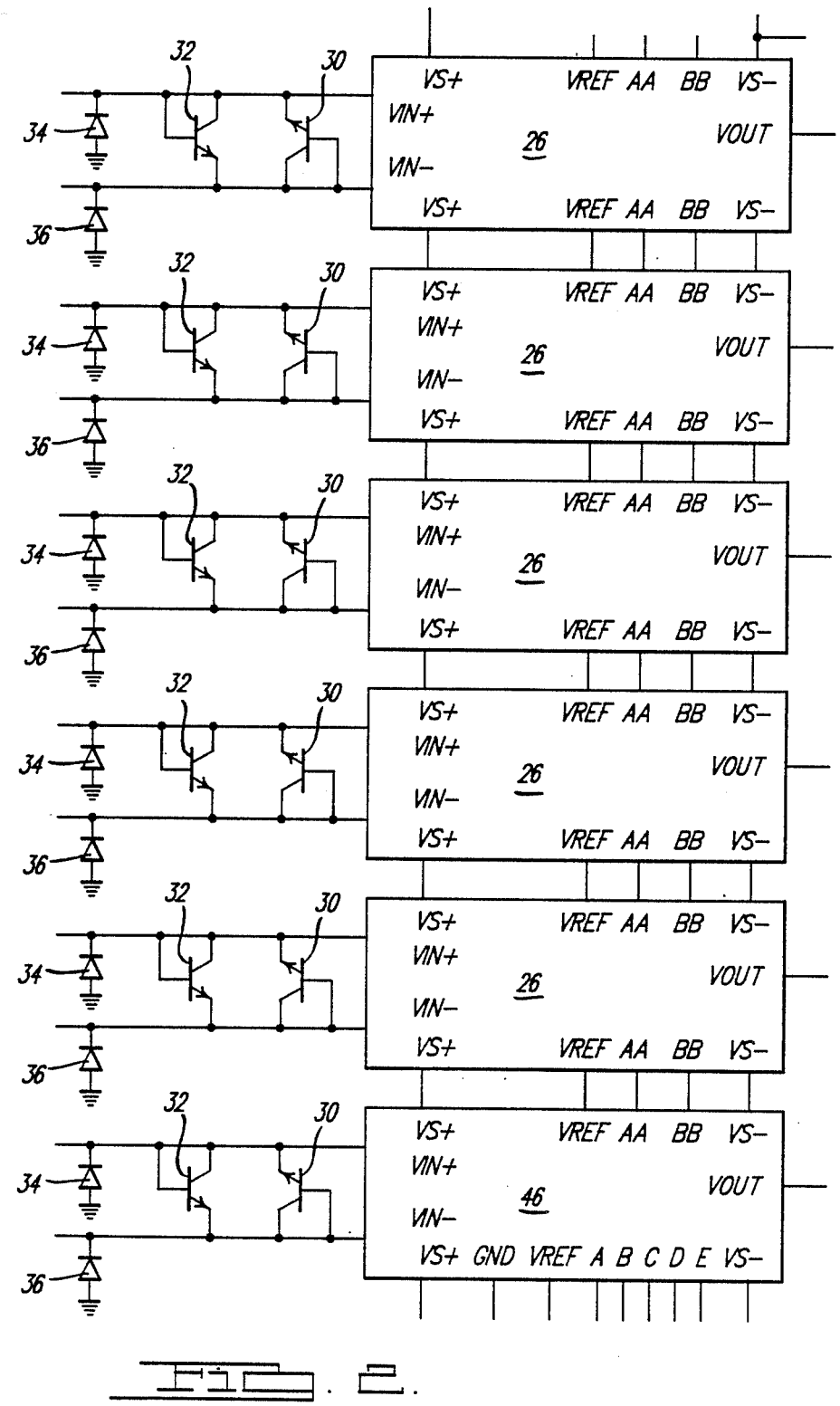
FIG. 2 illustrates five of the preamplifiers shown in FIG. 1 together with the voltage regulator used for driving the preamplifiers.
Figure 3:
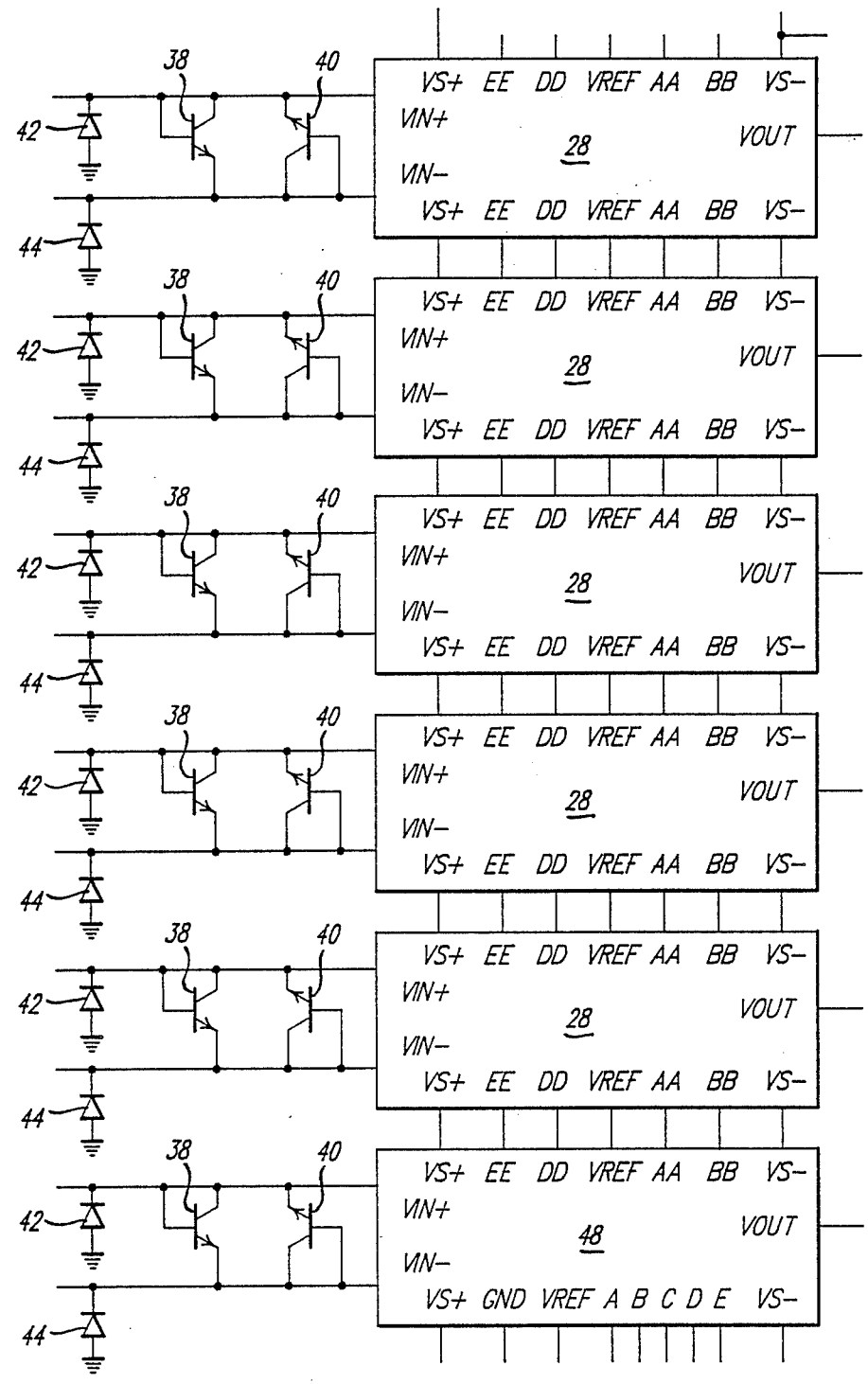
FIG. 3 illustrates five of the postamplifiers shown in FIG. 1 used in conjunction with the voltage regulator used for driving the postamplifiers.

While the components of the amplifier 24 are shown in FIG. 1 to be connected to one elemental detector in the detector array 10, it will be understood that the amplifier 24 comprises a sufficient number of preamplifiers 26 and postamplifiers 28 to process the outputs from each of the elemental detectors in the detector array 10. As shown in FIG. 2, the voltage regulator 46 drives five of the preamplifiers 26. Each of the preamplifiers 26 receives the input from an elemental detector at its VIN− terminal, while receiving an output from the voltage regulator 46 through the VIN+ terminal. The preamplifiers 26 are controlled by the voltage regulator 46 through five buses: VS+, VS−, VREF, AA and BB. The Bus VS+ and the Bus VS− provide supply voltages of nominally 8 and −10 volts respectively. The Bus VREF provides a reference voltage of 2.4 volts. In addition, the voltage regulator 46 is able to regulate the performance of the preamplifier 26 through the Buses AA and BB in the manner described below. The output which is delivered by the voltage regulator 46 to the Buses AA and BB is controlled by selective jumpering of the A, B, C, D and E terminals of the voltage regulator 46. In a similar fashion, the regulator 48 in FIG. 3 is used to drive five of the postamplifiers 28 by providing supply voltages of nominally 8 and −10 volts through the Bus VS+ and the Bus VS− respectively. A reference voltage of 2.4 volts generated by the voltage regulator 48 is also delivered to the postamplifier 28 through the Bus VREF. Finally, the performance of the postamplifiers 28 is controlled by the voltage regulator 48 through the Buses AA, BB, DD and EE in the manner described below. The output which is delivered by the voltage regulator 48 to the Buses AA, BB, DD and EE is controlled by selective jumpering of the A, B, C, D and E terminals.

Figure 4:
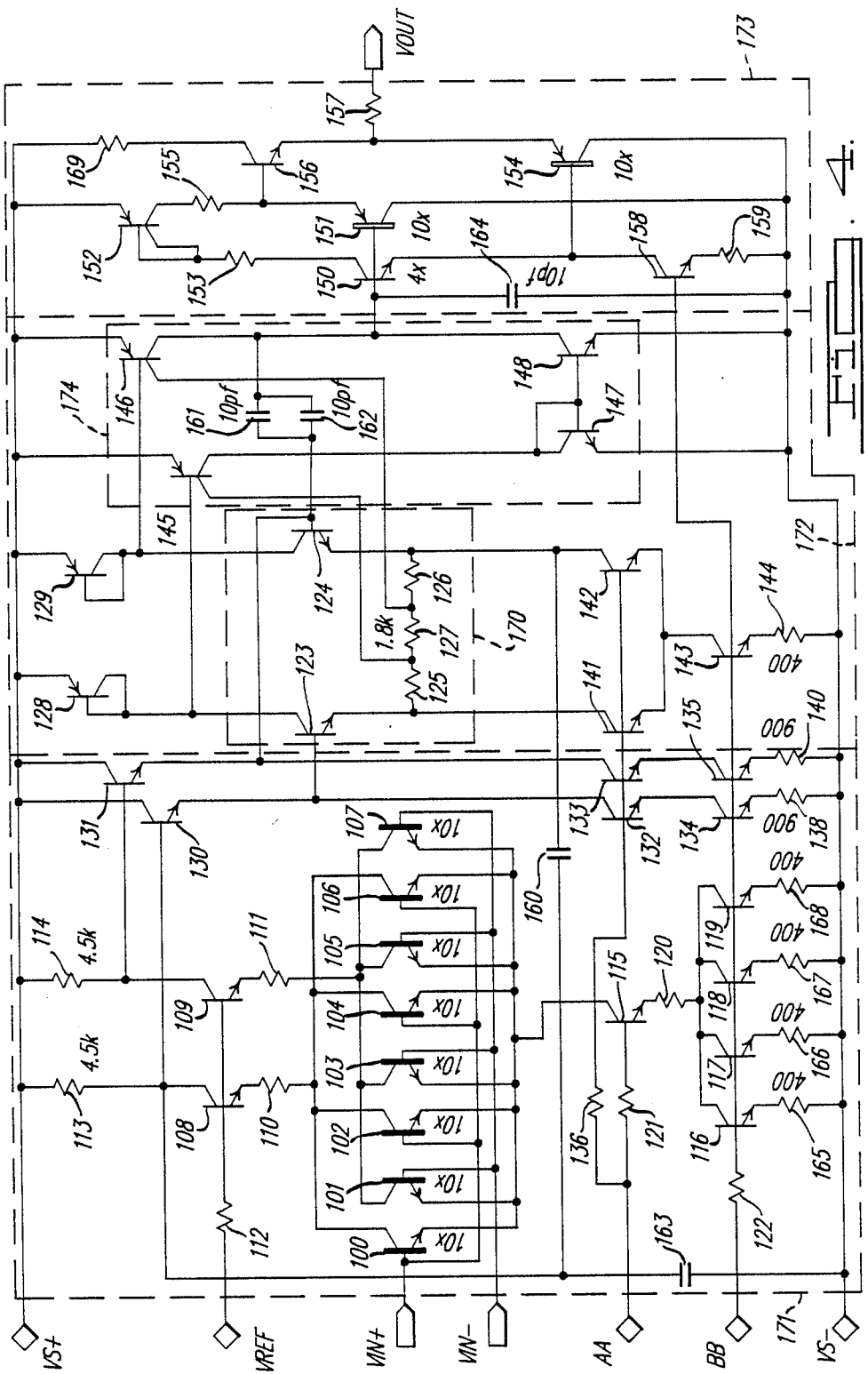
FIG. 4 is a schematic diagram of one of the preamplifiers shown in FIG. 2.
Figure 5:
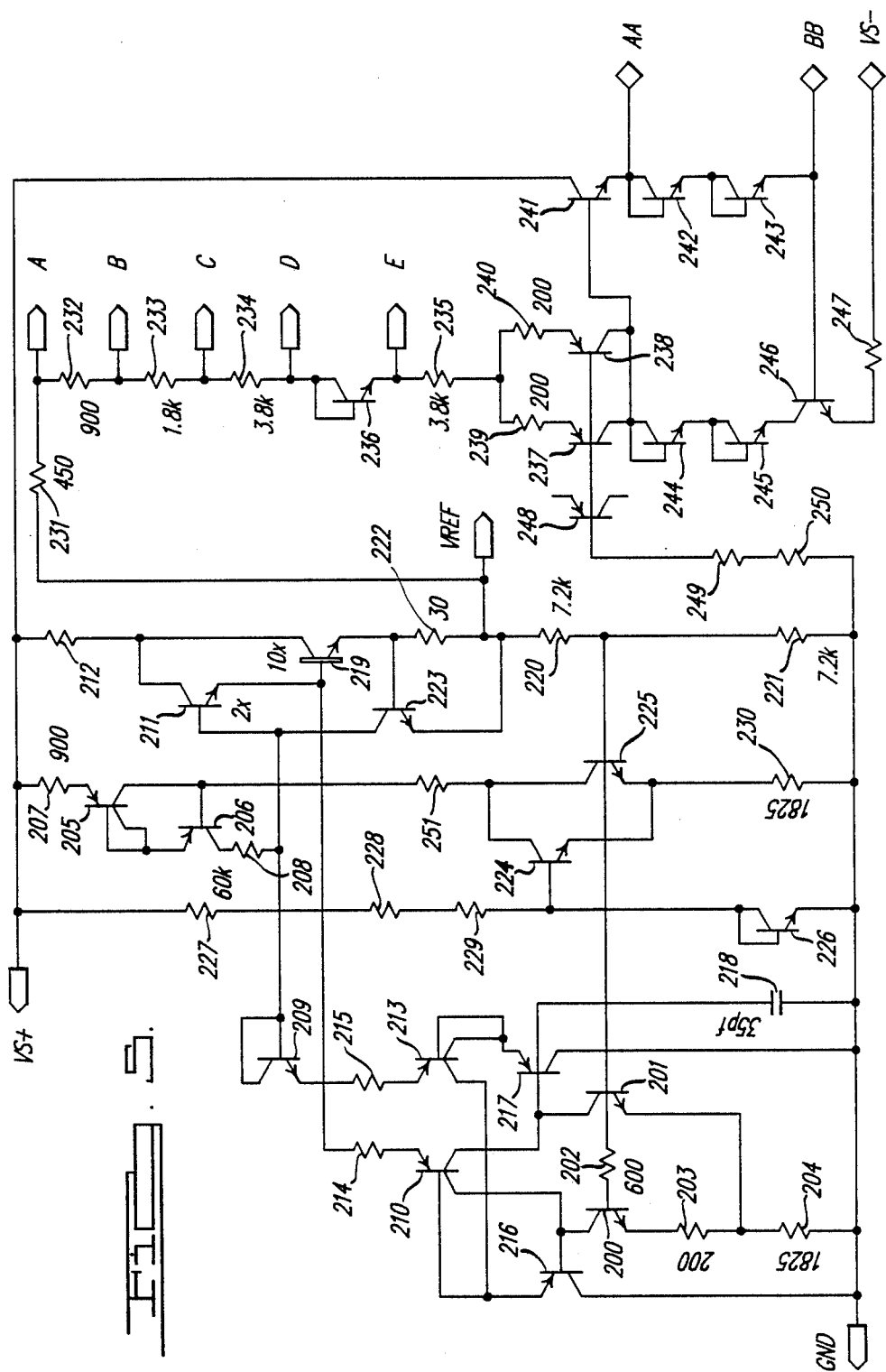
FIG. 5 is a schematic diagram of the voltage regulator shown in FIG. 2 used for providing a regulated source of voltage to the preamplifier.

As shown in FIG. 4, the preamplifier 26 comprises an input stage 171, intermediate stage 172, and an output stage 173. The input stage 171 comprises the transistors 100–107, the emitters of which are connected. The base of transistors 100, 102, 104 and 106 receive the output from the voltage regulator 46 through the VIN+ terminal, while the output from an elemental detector is delivered to the base of the transistors 101, 103, 105 and 107 through the VIN terminal. The transistors 100–107 are typically ten times the size of the other transistors in the preamplifier 26 described below. In addition, the base resistance of the transistors 100–107 is selected to be relatively low, being approximately 50 ohms or less. Because the transistors 100–107 are large in size and have a low base resistance, the thermal noise generated by the preamplifier 26 is lower than that which would otherwise be generated. It is to be understood, however, that the magnitude of the base resistance is selected to achieve the desired noise performance of the preamplifier 26.

To reduce large input capacitance which would otherwise be seen at the inputs to the transistors 100–107 as well as to reduce noise generated by the preamplifier 26, the transistors 108 and 109 are provided. The transistors 108 and 109 form a cascode amplifier which drives the collectors of the transistors 100–107 through the dive-under resistors 110 and 111. The bases of the transistors 108 and 109 are connected through the dive-under resistor 112 to the Bus VREF while the collectors of the transistors 108 and 109 are connected to the Bus VS+through the resistors 113 and 114. The resistors 113 and 114 each have resistance of 4.5K ohms and to provide proper first stage gain in conjunction with the transistors 100-107 from the Bus VS+.

To control the current drawn through the transistors 100-107, the transistors 115-119 are provided. The collector of the transistor 115 is connected to the emitters of the transistors 100-107, while the emitter of the transistor 115 is connected to the collectors of the transistors 116-119 through the dive-under resistor 120. In addition, the emitters of the transistors 116-119 are connected to the Bus VS—through the resistors 165-168. By connecting the base of the transistor 115 to the Bus AA through the dive-under resistor 121, and the base of the transistors 116-119 to the Bus BB through the dive-under resistor 122, the current which is drawn through the transistors 100-107 can be controlled by the voltage regulator 46.

To provide an intermediate stage 172 for the preamplifier 26 having a first differential amplifier, preamplifier 26 further comprises the transistors 123 and 124. The emitters of the transistors 123 and 124 are connected through the dive-under resistors 125 and 126 by a resistor 127 which has a value of 1.8K ohms. The transistors 123 and 124 and the resistors 125-127 form a first differential amplifier 170 which serves to increase the gain of the preamplifier 26. Resistor 127, together with the feedback transistors described below, limit the gain of the differential amplifier 170 so as to prevent oscillation at the input frequency of the preamplifier 26.

Current is delivered to the collectors of the transistors 123 and 124 through the transistors 128 and 129, the emitters of which are connected to the Bus VS+. To control the voltage delivered to the base of the transistors 123 and 124, the transistors 130-135 are provided. The emitter of the transistor 130 is connected to the base of the transistor 123, while the emitter of the transistor 131 is connected to the base of the transistor 124. The collectors of the transistors 130 and 131 are connected to the Bus VS+, while their bases are connected to the collectors of the transistors 108 and 109. Accordingly, the transistors 130 and 131 are able to deliver a voltage to the bases of the transistors 123 and 124. The emitters of the transistors 130 and 131 are also connected to the collectors of the transistors 132 and 133, the emitters of which are connected to the collectors of the transistors 134 and 135. The base of the transistors 132 and 133 are connected to the voltage regulator 46 through the Bus AA and the dive-under resistor 136, while the bases of the transistors 134 and 135 are connected to the voltage regulator 46 through the Bus BB and the dive-under resistor 122. The emitter of the transistor 134 is connected to the Bus VS—through the resistor 138, while the emitter of the transistor 135 is connected to the Bus VS—through the resistor 140. By controlling the voltage which is delivered by the Bus AA and the Bus BB to the bases of the transistors 132-135, the voltage regulator 46 can control the voltage delivered by the transistors 130 and 131 to the bases of the transistors 123 and 124 and therefore the performance of the first differential amplifier 170.

To control the current from the emitters of the transistors 123 and 124, the transistors 141-143 are provided. The collectors of the transistors 141 and 142 are connected to the emitters of the transistors 123 and 124 respectively, and the emitters of the transistors 141 and 142 are connected to the Bus VS—through the transistor 143 and the resistor 144. Because the bases of the transistors 141 and 142 are connected to the Bus AA through the dive-under resistor 136, and the base of the transistor 143 is connected to the Bus BB through the dive-under resistor 122, the current flowing from the emitters of the transistors 123 and 124 may be controlled by the regulator 46 by the current delivered by the Buses AA and BB to the bases of the transistors 141-143.

Because the potential for oscillation of the differential amplifier 170 increases with increasing gain, it is desirable to reduce the gain of the differential amplifier 170. To provide means for lowering the gain of the first differential amplifier, the feedback transistors 145 and 146 are provided which form the circuit 174. The emitters of the transistors 145 and 146 are connected to the Bus VS+, while the base of the transistor 145 is connected to the collector of the transistor 128 and the base of the transistor 146 is connected to the collector of the transistor 129. In addition, one collector from each of the transistors 145 and 146 are connected to either terminal of the resistor 127. The second collector from the transistor 145 is connected to the collector and base of the transistor 147, while the second collector of the transistor 146 is connected to the collector of the transistor 148. The transistors 147 and 148 form a current mirror which ensures that the current flowing from the collectors of the transistors 145 and 146 are the same. Because the transistors 145 and 146 provide negative feedback to the first differential amplifier 170, the gain of the differential amplifier 174 is reduced thereby reducing the likelihood that the input frequency from an elemental detector will cause the preamplifier 26 to oscillate.

To form the output stage 173 of the preamplifier 26, the output from the collector of the transistor 146 is delivered to the bases of the transistors 150 and 151. The collector of the transistor 150 is connected to the base and the first collector of the transistor 152 through a dive-under resistor 153. The emitter of the transistor 150 is connected to the base of a transistor 154 to provide a first voltage follower. In addition, the emitter of the transistor 151 is connected to a second collector of the transistor 152 through the dive-under resistor 155, as well as to the base of the transistor 156. The collector of the transistor 156 is connected to the Bus VS+through the dive-under resistor 169, while the emitter of the transistor 156 is connected to the emitter of the transistor 154. By connecting the transistors 151 and 156 in this manner, the transistors 151 and 156 form consecutive voltage followers. When the voltage increases at the bases of the transistors 150 and 151, the voltage at the emitter of the transistor 154 increases while the voltage at the base of the transistor 156 also increases. Accordingly, the voltage appearing at the emitters of the transistors 154 and 156 increases in an amount equal to that of the bases of the transistors 150 and 151. The output from the emitters of the transistors 154 and 156 is connected to the VOUT terminal of the preamplifier 26 through the resistor 157 which is used to stabilize the amplifier 24 when driving capacitive loads. The transistors 151 and 154 may be oriented vertically on a semiconductor chip so that they can source more current than would otherwise be possible.

The voltage regulator 46 is able to control the output stage of the preamplifier 26 by means of the transistor 158. The base of the transistor 158 is connected to the Bus BB, while the emitter of the transistor 158 is connected to the Bus VS− through the resistor 159. Because the collector of the transistor 158 is connected to the base of the transistor 154, the voltage appearing on the Bus BB can control the voltage at the emitter of the transistor 154 and therefore the output of the preamplifier 26.

To prevent oscillation of the preamplifier 26, the capacitors 161–164 are provided. The capacitor 160 has a capacitance of 30 picofarad and the capacitors 161 and 162 have capacitances of 10 picofarad. One plate of the capacitor 160 is connected to the Bus VS− through the capacitor 163, while the other plate of the capacitor 160 is connected to the emitter of the transistor 124. In addition, one of the plates of each of the capacitors 161 and 162 are connected to the base of the transistor 124, while the other plates of the capacitors 161 and 162 are connected to the collector of the transistor 146 and to the Bus VS− through the capacitor 164. The capacitors 163 and 164 are parasitic capacitors resulting from the formation of the capacitors 160–162.

The voltage regulator 46 is connected to the non-inverting input of the preamplifier 26 and is used to provide a regulated 2.4 volt supply to the preamplifier 26. To provide a voltage of 1.2 volts which is then doubled by other components of the voltage regulator 46, the voltage regulator 46 comprises the transistors 200 and 201. The transistor 200 is approximately four times the size of the transistor 201, and therefore has a current density of approximately one fourth of the current density in the transistor 201 when equivalent currents are delivered to the collectors of the transistors 200 and 201. Because the current density of the transistor 200 is one fourth the current density of the transistor 201, the base-emitter voltage of the transistor 200 is less than the base-emitter voltage of the transistor 201. Because the base of the transistor 200 is connected to the base of the transistor 201 through the resistor 202, the differences in the base-emitter voltages between the transistor 200 and 201 appear as a potential drop between the emitters of the transistors 200 and 201 which are connected through a resistor 203. The current flowing through the resistor 203, which is connected to ground through the resistor 204, causes a potential of 1.2 volts to appear at the base of the transistor 201. By connecting the transistors 200 and 201 in this manner, the potential at the base of the transistor 201 has relatively low variance with respect to changes in temperature.

To supply current to the collectors of the transistors 200 and 201, the transistors 205 and 206 are provided. The emitter of the transistor 205 is connected to the Bus VS+ through a resistor 207. The collectors of the transistor 205 are connected to the emitter and base of the transistor 206, as well as to the base of the transistor 205. The output from the collector of the transistor 206 is delivered through the dive-under resistor 208 to the base and the collector of the transistor 209 which operates as a diode. To ensure that the voltage at the collectors of the transistors 200 and 201 is the same, the transistors 210–213, 215–217 are provided. The emitter of the transistor 210 receives the output from the emitter of the transistor 211 through a resistor 214. The collector of the transistor 211 is connected to the Bus VS+ through the dive-under resistor 212, while the base of the transistor 211 is connected to the collector of the transistor 206 through the dive-under resistor 208. In addition, the emitter of the transistor 213 is connected to the collector of the transistor 206 through the transistor 209 and the resistors 208 and 217. The base of the transistor 210 is connected to the emitter of the transistor 215, the base of which is connected to the collector of the transistor 200. In addition, the base of the transistor 213 is connected to the emitter of the transistor 216, the base of which is connected to the collector of the transistor 210. The collectors of the transistor 210 are also connected to both the collector of the transistor 200 and the collector of the transistor 201, and the collectors of the transistor 213 are connected to the emitter of the transistor 215 as well as the emitter of the transistor 216. By connecting the transistors 210–217 in this manner, the voltage delivered to the collectors of the transistors 200 and 201 is equal. The base of the transistor 216 is connected to ground through the capacitor 218 which has a capacitance of 30 picofarad. The capacitor 217 serves to eliminate potential oscillation of the regulator 46.

To generate a potential of 2.4 volts from the 1.2 volt potential of the bases of the transistors 200 and 201, the transistors 219 and the resistors 220 and 221 are provided. The transistor 219 is a medium size transistor having a size of approximately twelve times that of the transistor 209. The relative size of the transistor 219 is chosen so that it can source more current than would otherwise be permissible using a smaller transistor. The collector of the transistor 219 is connected to the Bus VS+ through the dive-under resistor 212, while the base of the transistor 219 is connected to the emitter of the transistor 211. The output from the emitter of the transistor 219 is connected to ground through the resistors 220–222. Because the node between the transistors 220 and 221 is held at 1.2 volts by the base of the transistor 201, a voltage of 1.2 volts at the base of the transistor 201 generates a 2.4 volt potential at the node between the resistors 220 and 222 which is connected to the VREF terminal.

The resistor 222 and the transistor 223 are used to turn off the voltage regulator 46 when the current delivered by the Bus VREF exceeds 30 milliamps. When the current drawn by the Bus VREF increases to 30 milliamps, the base-emitter voltage of the transistor 223 increases due to the current being drawn through the resistor 223. As the base-emitter voltage of the transistor 223 increases, the transistor 223 begins to conduct. Because the base of the transistor 211 is connected to the collector of the transistor 223, the transistor 211 is brought out of conduction. Since the emitter of the transistor 211 is connected to the base of the transistor 219, the transistor 219 is also brought out of conduction. Accordingly, when the current drawn by the Bus VREF is greater than 30 milliamps, the transistor 223 causes the transistor 219 to stop conducting thereby terminating the flow of current through the Bus VREF.

To provide a start-up circuit for the regulator 46, the transistors 224–226 and the resistors 227–230 are provided. The base of the transistor 224 is connected to the VS+ Bus through the resistor 227 and the dive-under resistors 228 and 229, and to the collector of the transistor 226 which functions as a diode. In addition, the collectors of the transistor 224 and 225 are connected to the collector of the transistor 205 through the dive-under resistor 251. The emitters of the transistors 224 and 225 are connected to ground through the resistor 230. When the voltage regulator 46 is initially energized, the voltage delivered to the base of the transistor 224 through the resistors 227-229 is sufficient to cause the transistor 224 to conduct. Because the transistor 224 is able to conduct, the current delivered to the collector of the transistor 224 from the collector of the transistor 206 is able to be delivered to ground through the resistor 230. Accordingly, the transistor 205 also conducts thereby delivering current to the base and collector of the transistor 209 as well as to the base of the transistor 211. After the current begins to flow to the base of the transistors 209 and 211, the voltage at the base of the transistor 225 increases to 1.2 volts as the base of the transistor 225 is connected to the base of the transistor 201. When this occurs, the voltage at the emitter of the transistor 225, and hence of the emitter of the transistor 224, increases to a point where the transistor 224 is brought out of conduction. When this occurs, the current delivered to the resistor 230 flows only through the transistor 225.

To provide a programmable current source for use in conjunction with the preamplifier 26, the resistors 231-235 are provided. The resistors 231-235 form a resistive ladder, the nodes of which are connected to the A, B, C, D and E terminals of the voltage regulator 46 in the manner shown. The A, B, C, D and E terminals of the voltage regulator 46 may be jumpered to deliver the desired current to the current Bus AA, BB and EE. A transistor 236 is located between the resistors 234 and 235 which serves to compensate for temperature variation. The current delivered by the resistor 235 is supplied to the emitters of the transistors 237 and 238 through the resistors 239 and 240. The output from the collectors of the transistors 237 and 238 are delivered to the base of the transistor 241, the emitter of which is connected to the Bus AA. In addition, the emitter of the transistor 241 is connected to the base and collector of the transistor 242, and the emitter of the transistor 242 is connected to the base and the collector of the transistor 243. The output from the emitter of the transistor 243 is then delivered to the Bus BB. The collectors of the transistors 237 and 238 are connected to the collector and the base of the transistor 244. The emitter of the transistor 244 is connected to the collector and the base of the transistor 245, the emitter of which is connected to the collector of the transistor 246. The base of the transistor 246 is connected to the emitter of the transistor 243. The output from the emitter of the transistor 246 is then connected to the Bus VS— through the resistor 247. In addition, the bases of the transistors 237 and 238 as well as the parasidic transistor 248 are connected to ground through the dive-under resistors 249 and 250.

The components of the postamplifier 28 are similar to the components of the preamplifier 26. Accordingly, the labeling of the components of the postamplifier 28 is, with the exception of the first digit of the label, identical to the label used with the preamplifier 26. However, the input stage of the postamplifier 28 has only four large transistors 300-303 rather than the eight large transistors 100-107 in the preamplifier 26. Fewer transistors are needed in the postamplifier 28 as the postamplifier 28 can exhibit more noise. Because the number of large transistors in the postamplifier 28 is reduced, the current flowing through the transistor 315 in the postamplifier 28 is less than the current flowing through the transistor 115 in the preamplifier 26 so that the number of transistors in the postamplifier 28 receiving current from the resistor 320 is reduced. In addition, the resistors 375 and 376 are provided which may be connected in parallel with the resistors 313 and 314. When the resistors 375 and 376 are connected in this manner, the current delivered to the transistor 300-303 can be increased while maintaining equivalent gain and thereby reducing the transistors 308 and 309 noise generated by the postamplifier 28. Finally, the postamplifier 28 also has components which form part of the input current cancellation circuit described below. The input cancellation circuit is used to substantially eliminate the current which is delivered to the postamplifier 28 so as to reduce the voltage offset which would otherwise be generated due to the presence of the resistor 52.

Similarly, the components of the regulator 48 are similar to the components of the regulator 46. In addition, the regulator 46 further includes components which are part of an input current cancellation circuit 452 described below. The input cancellation circuit 452 comprises the transistors 377, 380, 427-435 and the dive-under resistors 378, 379, 381-383, and 463. The size of the transistors 453 and 454 is selected to be the same size as the transistors 300-303 of the postamplifier 28 so as to have the same current density. The collector of each of the transistors 453 and 454 is held at a potential equivalent to two diode drops below 2.4 volts by the transistors 455 and 456. In addition, the bases of each of the transistors 453 and 454 is held at one diode drop below ground by the transistor 457. Accordingly, the base-collector voltage on the transistors 453 and 454 is equivalent to the base-collector voltage on the transistors 300-303. In addition, the current which flows through each of the transistors 316 and 317 is the same as the current which flows through the transistor 458 as the bases of the transistors 316, 317 and 458 are all controlled by the Bus BB. Because the transistors 316 and 317 receive current from the transistors 300-303, the current flowing through each of the transistors 453 and 454 is equivalent to the current flowing through each of the transistors 300-303. The emitter of the transistor 458 is connected to the Bus VS+, while the emitter of the transistor 377 is connected to the Bus VS+ through the dive-under resistor 378. In addition, the base of the transistor 458 is connected to the base of the transistor 377 through the dive-under resistor 379. Accordingly, the base current which passes through the transistors 453 and 454 which is delivered through one of the collectors of the transistor 458 appears at each of the collectors of the transistor 377.

The current at the collectors of the transistor 377 is delivered to the transistor 380. The base of the transistor 380 is connected through the dive-under resistor 381 to the base of the transistor 459 compensates for the base current which was added by the transistor 434 which has an emitter connected to the collector of the transistor 462, and a collector connected to the collector of the transistor 457. The transistor 459 raises the current delivered to the transistor 462 to compensate for the current which was removed by the transistor 457. Because the collectors of the transistors 380 is delivered to the VIN+ input of the postamplifier 28 through the dive-under resistor 382, and the VIN— input through the dive-under resistor 383, the transistor 380 is able to supply the current which would otherwise be drawn by the transistors 300-303 through the VIN+ and VIN— terminals. The input cancellation circuit also comprises the transistor 460 which acts as a buffer, and a transistor 461 which is used to drive the transistors connected to the Bus AA.

By providing large transistors in both the preamplifier and the postamplifier, the noise performance of the amplifier is greatly improved. In addition, noise performance is improved by locating more of the PNP transistors near the output of the preamplifier and the postamplifier. Finally, uniform characteristics over wide temperature variation is permitted by using the voltage regulators described above in connection with the preamplifier and the postamplifier. It should be understood that the invention was described in connection with a particular example thereof. Also, by providing the feedback to the intermediate gain stage increases, the amplifier band width and stability increases. Other modifications will become apparent to those skilled in the art after study of the specification and drawings and the following claims.

What is claimed is:

1. An apparatus for amplifying the output from an elemental detector comprising:
   a preamplifier for amplifying the output of said elemental detector, said preamplifier comprising:
   (a) a first differential amplifier comprising a first plurality of transistors,
   (b) means for lowering the gain of said first differential amplifier comprising a second plurality of transistors,
   (c) a third plurality of transistors operable to receive the output of said elemental detector, said third plurality of transistors being larger than said first and second plurality of transistors; and
   a postamplifier for amplifying the output of said preamplifier, said postamplifier comprising:
   (a) a second differential amplifier, and
   (b) means for lowering the gain of said second differential amplifier.

2. The apparatus of claim 1, wherein said first plurality of transistors have emitters which electrically communicate through a first resistor.

3. The apparatus of claim 2, wherein said second plurality of transistors are operable to provide feedback to said first plurality of transistors.

4. The apparatus of claim 1, wherein said second differential amplifier comprises a fourth plurality of transistors each having emitters which electrically communicate through a resistor.

5. The apparatus of claim 4, wherein said means for lowering the gain of said second differential amplifier comprises a fifth plurality of transistors operable to provide feedback to said fourth plurality of transistors.

6. The apparatus of claim 1, wherein each of the transistors in said third plurality of transistors have a base resistance selected to reduce the noise generated by said preamplifier to a preselected level.

7. The apparatus in claim 6, wherein the base resistance of each of the transistors in said third plurality of transistors is approximately 50 ohms.

8. The apparatus of claim 5, wherein said postamplifier further comprises a sixth plurality of transistors electrically communicating with said second differential amplifier and being operable to receive the output of said preamplifier, each of the transistors in said sixth plurality of transistors having a base resistance selected to reduce the noise generated by said postamplifier to a preselected level.

9. The apparatus of claim 8, wherein the base resistance of each of the transistors in said sixth plurality of transistors is approximately 50 ohms.

10. An apparatus for amplifying the output of an elemental detector comprising:
   first means for signal amplification operable to generate an output in response to the output from said elemental detector, said first means for signal amplification comprising:
   (a) an input stage having a plurality of transistors which receive the output of said elemental detector,
   (b) an intermediate stage comprising first and second transistors, said first and second transistors in said intermediate stage being smaller than each of said plurality of transistors in said input stage;
   first means for voltage regulation operable to provide a regulated voltage to said first means for signal amplification;
   second means for signal amplification operable to generate an output in response to the output from said first means for signal amplification, said second means for signal amplification having a second differential amplifier; and
   second means for voltage regulation operable to provide a regulated voltage to said second means for signal amplification.

11. The apparatus of claim 10, wherein said first means for voltage regulation being operable to provide a programmable source of current to said first means for signal amplification.

12. The apparatus of claim 11, wherein said second means for voltage regulation being operable to provide a programmable source of current to said second means for signal amplification.

13. The apparatus of claim 12, wherein
   said first and second transistors of said intermediate stage have emitters electrically communicating through a resistor, said intermediate stage further having a first feedback transistor with a base electrically communicating with the collector of said first transistor of said intermediate stage and a collector electrically communicating to the emitter of said first transistor of said intermediate stage, said intermediate stage further having a second feedback transistor having a base electrically communicating with the collector of said second transistor of said intermediate stage, said second feedback transistor having a collector electrically communicating with the emitter of said second transistor of said intermediate stage.

14. The apparatus of claim 13, wherein said second means for signal amplification comprises:
   an input stage comprising first and second transistors having a base resistance selected to reduce noise; and
   an intermediate stage having first and second transistors with emitters electrically communicating through a resistor, said intermediate stage further having a first feedback transistor with a base electrically communicating with the collector of said first transistor of said intermediate stage of said second means for signal amplification and a collector electrically communicating with the emitter of said first transistor of said intermediate stage of said second means for signal amplification, said intermediate stage further having a second feedback transistor having a base electrically communicating with the collector of said second transistor of said intermediate stage of said second means for signal amplification, said second feedback transistor having a collector electrically communicating with the emitter of said second transistor of said intermediate stage of said second means for signal amplification.

15. The apparatus of claim 14, wherein said second means for voltage regulation comprises current cancellation means for substantially cancelling the current delivered to the bases of said first and second transistors of the input stage of said second means for signal amplification.

16. A method for amplifying the output from an elemental detector comprising the steps of:
  delivering the output of said elemental detector to first means for signal amplification, said first means for signal amplification comprising:
  (a) an input stage comprising first and second transistors each having a base resistance selected to reduce noise; and
  (b) an intermediate stage having third and fourth transistors having emitters which electrically communicate through a first resistance, said intermediate stage having a first feedback transistor with a base electrically communicating with the collector of said third transistor and a collector electrically communicating to the emitter of said third transistor, said intermediate stage further having a second feedback transistor with a base electrically communicating with the collector of said fourth transistor, said second feedback transistor having a collector electrically communicating with the emitter of said fourth transistor, said third and fourth transistors of said intermediate stage being smaller than the first and second transistors in said input stage; and
  delivering the output of said first means for signal amplification to second means for signal amplification, said second means for signal amplification comprising:
  (a) a second differential amplifier; and
  (b) means for lowering the gain of said second differential amplifier.

17. The method of claim 16, wherein said step of delivering the output of said first means for signal amplification comprises:
  delivering the output of said first means for signal amplification an input stage of said second means for signal amplification comprising fifth and sixth transistors having a base resistance selected to reduce noise; and
  delivering the output of said input stage of said second means for signal amplification to an intermediate stage of said second means for signal amplification having a seventh and eighth transistor having emitters electrically communicating through a resistor, said intermediate stage further having a third feedback transistor with a base electrically communicating with the collector of said seventh transistor and a collector electrically communicating with the emitter of said seventh transistor, said intermediate stage further having a fourth feedback transistor with a base electrically communicating with the collector of said eighth transistor, said fourth feedback transistor having a collector electrically communicating with the emitter of said eighth transistor.

18. The method of claim 17, further comprising the additional step of cancelling the current delivered to the bases of said fifth and sixth transistors of the input stage of said second means for signal amplification from said first means for signal amplification.

* * * * *